United States Patent [19]

Chang et al.

[11] 4,188,245
[45] Feb. 12, 1980

[54] SELECTIVE OPEN TUBE ALUMINUM DIFFUSION

[75] Inventors: Mike F. Chang, Liverpool; Alfred Roesch, Auburn; Richard W. Kennedy, Skaneateles, all of N.Y.

[73] Assignee: General Electric Company, Auburn, N.Y.

[21] Appl. No.: 943,451

[22] Filed: Sep. 18, 1978

[51] Int. Cl.² ............................................. H01L 21/22
[52] U.S. Cl. ..................................... 148/188; 148/189
[58] Field of Search ............................... 148/188, 189

[56] References Cited

U.S. PATENT DOCUMENTS

| | | | |
|---|---|---|---|
| 3,972,838 | 8/1976 | Yamashita | 148/189 X |
| 4,040,878 | 8/1977 | Rowe | 148/1.5 X |

*Primary Examiner*—G. Ozaki
*Attorney, Agent, or Firm*—Robert J. Mooney; Stephen B. Salai

[57] ABSTRACT

A method for selectively diffusing a semiconductor body with p-conductivity type impurities utilizing aluminum as a diffusion source and able to be performed in a reuseable open diffusion tube is described. A gas flow is established in the diffusion tube which is essentially an inert gas and includes from one to ten percent oxygen. Simultaneous blanket and selective diffusions may be formed in accordance with this invention by modifying the amount of oxygen in the flow.

6 Claims, 7 Drawing Figures

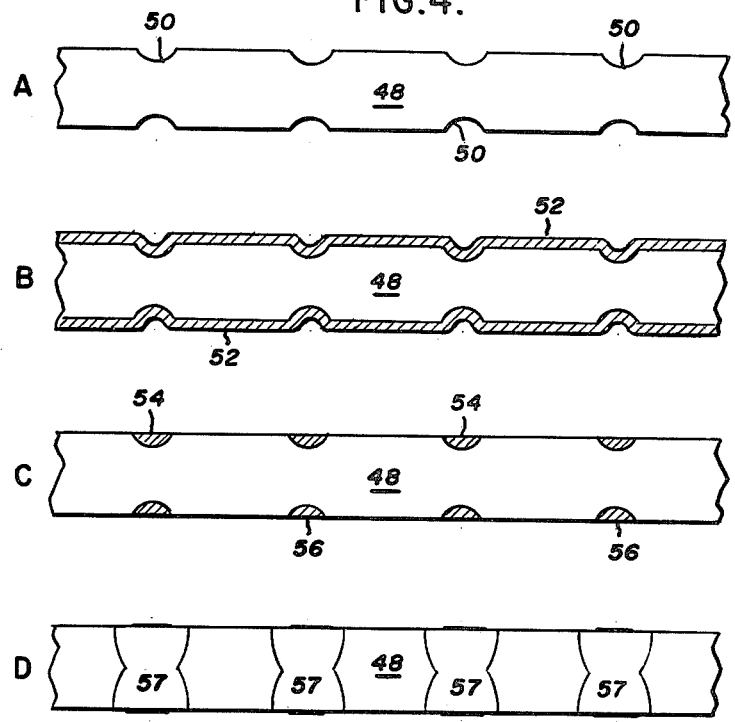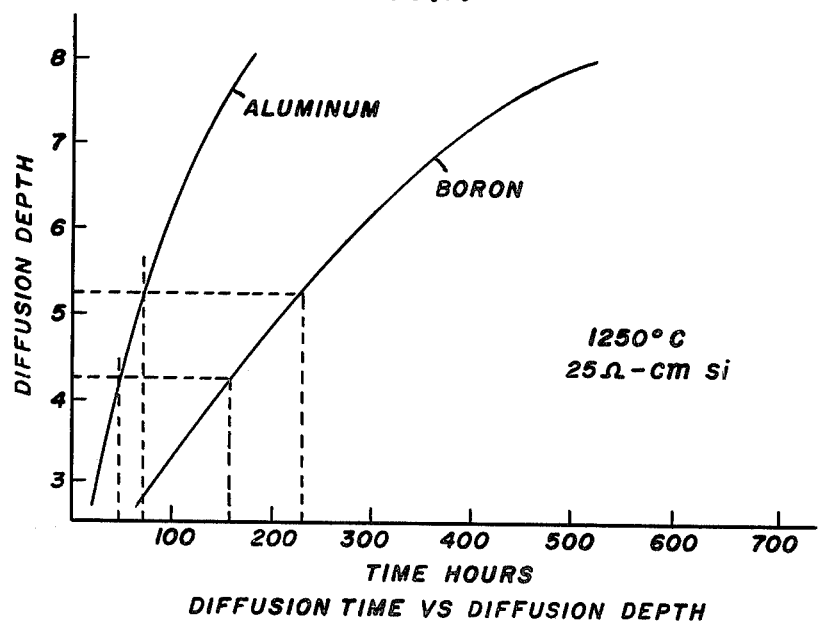

SELECTIVE OPEN TUBE ALUMINUM DIFFUSION

This invention relates in general to the diffusion of semiconductor wafers with aluminum and more particularly to the selective diffusion of aluminum into semiconductor wafers in an open diffusion tube.

Aluminum provides many advantages as a dopant for fabricating semiconductor devices. It is a rapid diffuser and produces junctions of a high quality with respect to breakdown voltage. Additionally, aluminum introduces lower stresses in silicon than other dopants as for example boron due to its better fit in the crystal lattice.

Historically, aluminum has been relatively little used for fabricating semiconductor devices manufactured utilizing Czochralski (CZ) silicon which includes substantial amounts of oxygen, at least compared to float zone silicon. Attempts to diffuse aluminum into CZ silicon produced unacceptable numbers of aluminum oxide complexes in the semiconductor. The failure of aluminum diffusion with respect to Czochralski silicon produced a disposition against the use of aluminum as a dopant which has persisted even into the present when float zone silicon, which is relatively lower in oxygen content, is used in a large number of semiconductor devices.

Some success appears to have been attained in the use of aluminum as the dopant in a closed diffusion tube. The closed tube diffusion process suffers from several disadvantages. Generally speaking a sealed diffusion tube is opened by breaking or otherwise destroying at least a portion of the tube to allow the removal of the diffused wafers therefrom. As the price of quartz, a commonly utilized material for diffusion tubes, increases, the economic disadvantages of closed tube diffusion become more acute. It is therefore desirable to perform diffusion operations in an open tube which may be reused a number of times.

It is another disadvantage of closed tube aluminum diffusion that the concentrations of impurity atoms which are attainable are less than are oftentimes required to fabricate certain semiconductor devices. Typically, impurity concentrations of no more than about $5 \times 10^{16}$ atoms/cc are achievable while it is commonplace to require impurity concentrations to about $10^{19}$ or greater in certain devices. For this reason, although closed tube aluminum diffusion is employed in certain instances, it is nevertheless utilized very infrequently and for limited classes of devices. Further, even where closed tube aluminum diffusion is employed for forming devices, it is invariably performed to provide blanket diffusions, that is to say, diffusions that cover the entire surface of the wafer to be diffused. While the ability to perform blanket diffusion is useful and the advantage in being able to use aluminum therefor is substantial, it is, nevertheless, desirable to be able to perform selective diffusion for forming regions in a wafer, for example isolation regions, the extent of which is less than the entire surface of the wafer.

Accordingly, it is an object of this invention to provide a method for forming semiconductor devices utilizing aluminum as a dopant which method provides for the diffusion of aluminum into a semiconductor wafer in an open diffusion tube.

It is another object of this invention to provide a method for the open tube diffusion of aluminum wherein selective diffusion is possible.

It is yet another object of this invention to provide a process for the diffusion of aluminum into a substrate wherein both a shallow blanket diffusion and a deeper isolation diffusion may be formed simultaneously.

These and other objects of the instant invention are provided by a process for the diffusion of aluminum into a semiconductor wafer wherein a pattern of aluminum is formed on the surface of the wafer and diffusion is then carried out in an atmosphere including an inert gas and a preselected controlled amount of oxygen for forming a p-conductivity type region beneath the aluminum pattern.

In accordance with one aspect of this invention, an aluminum pattern may be formed on a semiconductor wafer by the predeposition of aluminum on the entire surface of the wafer followed by the etching away of the aluminum except in those areas where diffusion is desired. In accordance with an alternative embodiment of this invention, the surface of the wafer is grooved where diffusion is desired. Aluminum is then deposited over the entire surface of the wafer and the wafer is then lapped to leave patterned aluminum only in the grooves.

The diffusion itself is carried out at a temperature which is somewhat lower than has heretofore been required for achieving reasonable diffusion times with prior art diffusants as, for example, boron. It has been found that diffusion times as short as one quarter to one third of the time required for providing boron diffusions may be employed, utilizing aluminum in accordance with this invention.

In the alternative, where short diffusion times are not particularly important, it is an advantage of this invention that relatively lower diffusion temperatures may be employed than have been heretofore possible in accordance with the prior art. While it has been the practice to perform diffusions at temperatures at or exceeding 1250° C., diffusions may be performed in accordance with the instant invention at 1200° C. or lower while retaining the advantage of shorter diffusion times, and additionally, obtaining the benefits of lower stresses in the wafers due to the better fit of aluminum atoms in the silicon lattice than other commonly employed dopants such as boron, and further, providing substantially improved yields due to lower breakage of wafers during diffusion and subsequent processing.

In accordance with another feature of this invention, blanket diffusions and isolation diffusions may be simultaneously formed. By introducing a controlled amount of oxygen into the gas flow over the wafers during the diffusion process, the patterned aluminum which provided the source for the deep isolation diffusions also provides a source of dopant atoms which diffuse into the nonpatterned portion of the wafer providing a shallower blanket diffusion. This aspect of the instant invention provides for the combination of what heretofore would have been multiple diffusion steps in a single step with consequent cost savings.

The features of the invention which are believed to be novel are pointed out with particularity in the appended claims. The invention itself, however, both as to its organization and method of operation together with further objects and advantages thereof may best be understood by reference to the following description taken in connection with the accompanying drawings in which:

FIG. 4 illustrates the steps for forming a patterned wafer in accordance with an alternative method of this invention;

FIG. 7 is a graphical representation of the times required for diffusions to various depths in accordance with this invention compared to those of the prior art.

Figure 1:
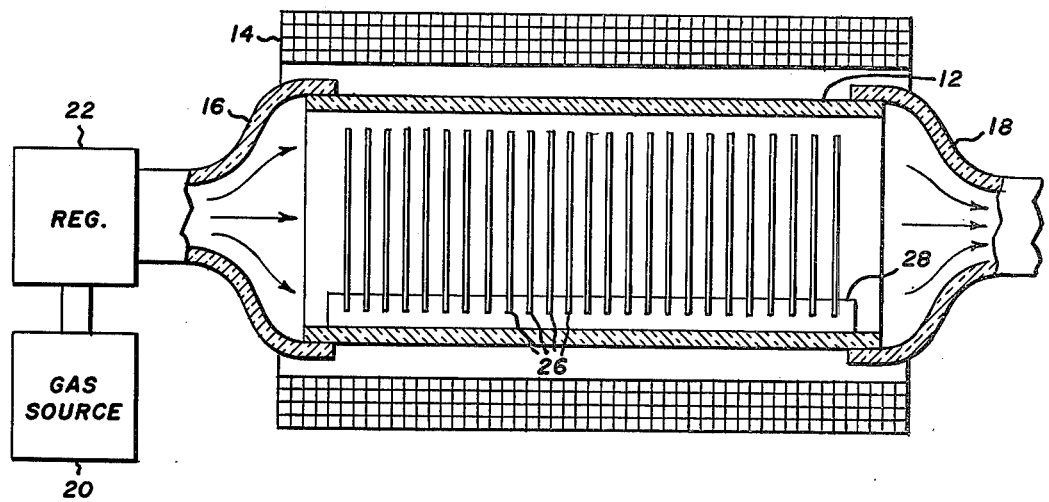
FIG. 1 is a diagrammatic view of apparatus for practicing the method of this invention.

Apparatus for performing selective aluminum diffusion in an open diffusion tube in accordance with this invention is illustrated in FIG. 1. An open diffusion tube 12 is disposed within heating element 14. Heating element 14 may conveniently be part of a conventional diffusion furnace as is well known to those skilled in the art. In order to minimize the cost of practicing this invention, tube 12 may be a quartz diffusion tube. In the alternative, a silicon tube may be used. Couplers 16 and 18 are disposed in non-sealing relationship on the ends of tube 12. Coupler 16 provides communication between gas source 20 and the interior of tube 12 for providing a steady gas flow therethrough. Regulator 22 is connected between gas source 20 and coupler 16 for regulating and providing for the adjustment of the gas supplied to the diffusion tube. Coupler 18 couples the opposite end of diffusion tube 12 to the ambient for exhausting the gas from tube 12. While couplers 16 and 18 need not provide the degree of sealing to tube 12 which would be required for practicing closed tube diffusion, they should provide a sufficient degree of sealing so that ambient air does not enter the tube during the diffusion process. This requirement is easily met as the flow of gasses from gas source 20 produces a positive pressure within the tube. Similarly, the reduction of the tube diameter to the coupler output diameter insures that the flow of exhaust gas from the coupler will inhibit any ambient air flow into the tube. It has been found, as will be more fully discussed below, that a gas flow of at least about 1–2 liters per minute is preferred during the practicing of this invention. The desired rate of flow of gas through open diffusion tube 12 depends upon the diameter of the tube. For a tube having an inside diameter of about 100 millimeters, a rate of gas flow of at least one liter per minute; preferably, two to three liters per minute provides good results. It will be understood that where larger or smaller tubes are used that the rate of flow of gas may be modified to compensate for the variation in tube size.

A plurality of wafers 26 is disposed within tube 12. Wafers 26 are supported by a boat 28 which slides into and out of tube 12. While wafers 26 are illustrated as being oriented perpendicular to the direction of gas flow within tube 12, it may in the alternative be desirable to orient them parallel to the flow of gas. As will be described, an aluminum pattern is formed on each of wafers 26 prior to insertion into tube 12 for diffusion.

Gas source 20 provides a source of an inert gas such as argon or nitrogen, and a source of oxygen. The total flow rate is at least about 1–2 liters per minute 2–4 liters being preferred. The gas flow is essentially inert gas with between about zero and ten percent oxygen. While substantially pure argon is used in the exemplary embodiment of this invention hereinabove described, other gasses may also be utilized. In addition to the inert gasses which are otherwise suitable for open tube diffusion as is understood by those skilled in the art, non strictly inert gasses which do not react with aluminum and which do not introduce undesirable impurities which either react with the semiconductor target wafers or diffuse into the wafers may be employed. Nitrogen has been found to provide good results in accordance with this invention, and it will be understood that, as used herein, inert means inert with respect to the semiconductor and aluminum, and not necessarily inert with respect to all elements.

Figure 2:
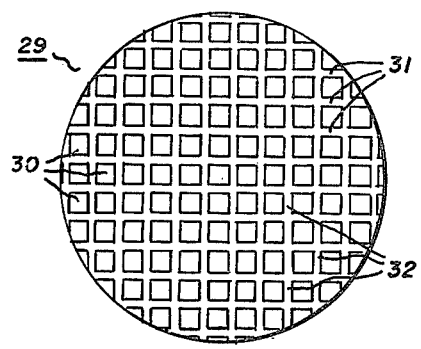
FIG. 2 is a top view of a silicon semiconductor wafer having an aluminum pattern thereon for use in accordance with the method of this invention.

The temperature at which diffusion is performed in accordance with this invention may, if desired, be somewhat lower than has been heretofore possible in accordance with the prior art. Lower diffusion temperatures are desirable as they result in higher yields and lower stresses in the device. While lower temperatures are desirable, they require longer diffusion times. Since the rate of diffusion of aluminum in accordance with the teachings of this invention is much greater than that of prior art impurities such as boron, lower temperatures are possible without increasing, and in most cases while actually decreasing, diffusion time. It is preferred in accordance with this invention to carry out the diffusion at a temperature of between about 1200° C. and 1250° C. although lower temperatures are feasible. While virtually any selective diffusion may be performed in accordance with the method of this invention, the invention is particularly well adapted for providing isolation diffusions of the type conventionally employed for isolating devices which are formed as a multiplicity of pellets on a single semiconductor wafer. One such wafer is illustrated at FIG. 2 wherein wafer 29 has a pattern of aluminum formed on each major surface thereof. It will be appreciated that depending upon the size of the devices to be formed, many thousands of individual pellets may be included on a single wafer. For purposes of clarity and ease of illustration only, a few such pellets are illustrated in FIG. 2. Pellets 30 are defined by the intersections of aluminum streets 31 and avenues 32 which cover the surface of the wafer.

Figure 3:
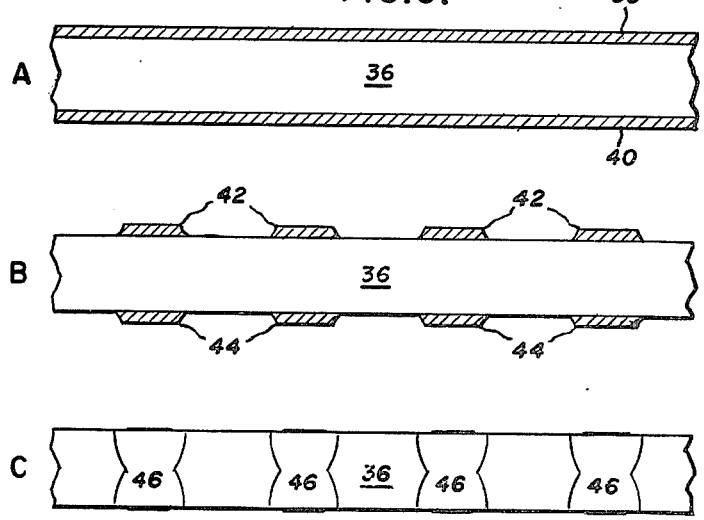
FIG. 3 illustrates the steps for forming a patterned wafer of the type illustrated in FIG. 2.

The method for forming an aluminum pattern in accordance with this invention may take one of several forms. FIG. 3 illustrates one such method in accordance with this invention wherein a silicon wafer 36 is provided with aluminum layers 38 and 40 on opposing major surfaces thereof. While layers 38 and 40 are conveniently formed by depositing a layer of aluminum on the silicon wafer as for example by sputtering, vapor deposition or the like; as an alternative, aluminum may be plated on the wafer by any of the well known methods for the accomplishment thereof. Preferably, a thickness of aluminum of about 30 thousand angstroms (KÅ) on each side of the wafer should be provided. Portions of aluminum layers 38 and 40 are removed to form the desired aluminum pattern prior to diffusion. Preferably, photolithographic patterning techniques may be used wherein a photosensitive resist is applied to the surface of the aluminum, exposed through a mask, and then etched to remove aluminum except in those areas where it is desirable to form diffused regions. After etching, it is preferable in accordance with the teachings of this invention, to clean the patterned wafer as, for example, in hydrochloric acid or aqua regia which will not only remove heavy metals from the surface of the wafer but will also etch away a portion of the aluminum. A sequence of cleaning steps which provide adequate results in accordance with this invention includes; first, cleaning in dilute hydrofluoric acid having a concentration on the order of twenty percent to remove the thin oxide; followed by degreasing in a combination of ammonium hydroxide and hydrogen peroxide which may be a 50-50 solution; then followed by cleaning in boiling aqua regia to remove heavy metal impurities, which cleaning step also removes a portion of the aluminum. The remaining aluminum pattern 42 on one side of the wafer and 44 on the reverse side provides the source for diffusion during the drive in cycle. As has been described, and will be more extensively described hereinbelow, the drive in cycle may take place at a temperature of about 1200° C. for a time determined by the thickness of the wafer to form isolation regions 46.

An alternative method for forming the aluminum patterns which are required for diffusion in accordance with this invention is illustrated by the steps of FIG. 4. Wafer 48 is etched to provide grooves 50 where the aluminum pattern is ultimately desired to reside. Grooves 50 may be formed by any method well known to those skilled in the art, for example, by photolithographically patterning the surfaces of wafer 48 and then etching in those areas as defined by exposure through a mask or the like. Aluminum layer 52 is then deposited over the entire surface of the wafer, including the grooves. The thickness of the aluminum is preferably on the order of about 30 KÅ. After deposition of aluminum, the entire wafer is lapped on both sides to remove all of the aluminum except in the previously defined grooves. A pattern of aluminum remains on each side which is defined by the grooves and which is designated 54 on the top and 56 on the bottom. The patterned wafer thus produced is preferably cleaned as described hereinabove with reference to FIG. 3, and the open tube aluminum diffusion is carried out resulting in the formation of regions 57, as is illustrated in FIG. 4D.

Figure 5:
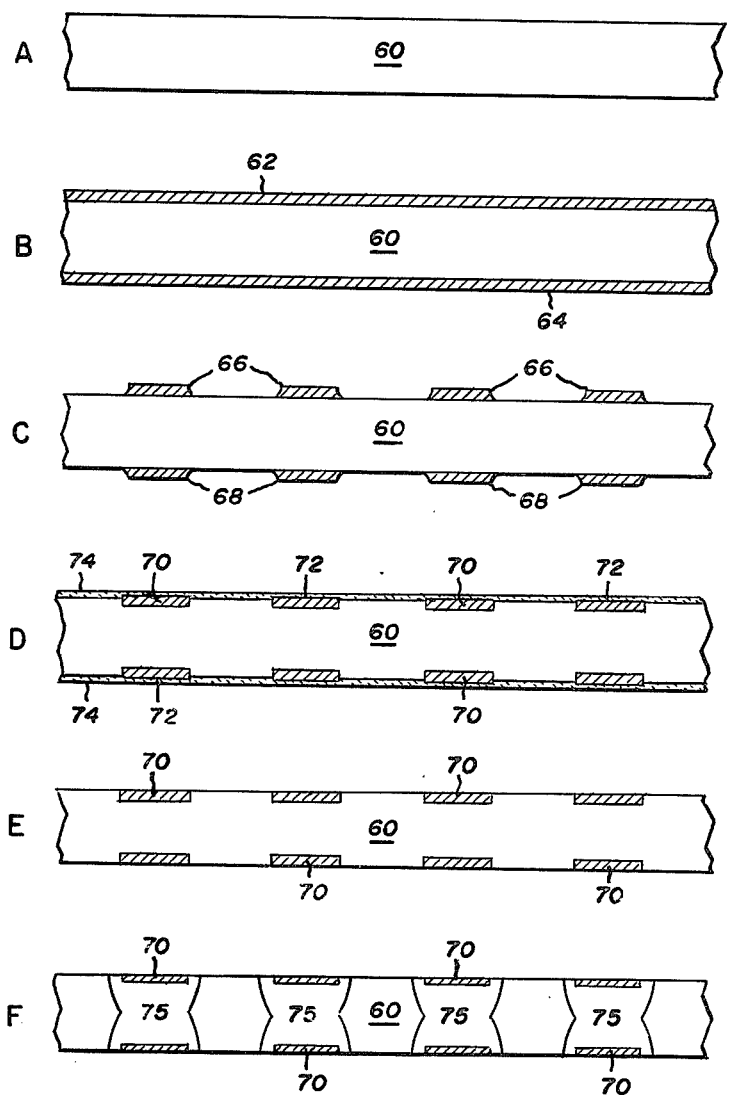
FIG. 5 illustrates the steps for forming a patterned wafer in accordance with yet another alternative method of this invention.

FIG. 5 illustrates yet another and preferred method of forming an aluminum pattern for the selective open tube diffusion of aluminum in accordance with this invention. The silicon wafer 60 is prepared for metallization by cleaning as is conventional as, for example, in ammonium hydroxide, hydrochloric acid, aqua regia or the like. Aluminum layers 62 and 64 are formed on the top and bottom surfaces of wafer 60 by plating, sputtering, or other well known processes for depositing metal on semiconductor wafers. It is preferred that the thickness of the layers 62 and 64 be at least about 30 KÅ so that the subsequent operations which tend to remove a certain amount of metallic aluminum will nevertheless leave an adequate thickness for performing the open tube selective aluminum diffusion of this invention. Aluminum layers 62 and 64 are patterned as for example by photolithography to leave isolated aluminum regions, 66, on the top surface, and, 68, on the bottom surface. It will be understood that regions 66 and 68 may conveniently be in the form of aluminum streets and avenues as was hereinabove illustrated and described in conjunction with FIG. 2. After patterning, wafers are preferably cleaned again in hydrochloric acid or aqua regia as was described in connection with FIG. 3 to eliminate heavy metal contaminants. It will be appreciated that this cleaning removes some of the aluminum from the desired patterns but that by providing a sufficient initial thickness, this loss of metal is acceptable as the thickness which is left is sufficient to provide an adequate diffusion. It has been determined that a thickness after cleaning of at least 500 Å provides good results if uniform over the entire pattern. In order to provide a reasonable assurance of at least 500 Å minimum thickness, it has been found that a nominal thickness of 2000 Å is preferred. After cleaning, the aluminum is alloyed with the silicon wafer by heating to a temperature of about 1000° C. for two to four hours. Preferably, this heating is carried out in an atmosphere of argon or nitrogen and including between about 1 and 2 percent oxygen. The alloying process results in regions 70 within the silicon wafer which are an alloy of aluminum and silicon, or at least have a very high concentration of Al (greater than $10^{20}$ atoms/cm$^3$), and layer 74 is produced covering the surfaces of the wafer. The several regions are formed both on the top and the bottom of the device. It is preferable that the wafer be deglassed before further processing as for example, by etching in dilute HF, rinsing in NH$_4$OH+H$_2$O$_2$ followed by an aqua regia and water rinse. This cleaning will remove glass layer 74. Metallic aluminum layer 72 may be removed along with heavy metal impurities yielding the device shown in FIG. 5E which includes alloyed aluminum silicon regions 70 on the top and bottom surfaces of the wafer. These regions provide a preferred source of aluminum atoms during the subsequent diffusion process. The diffusion itself is preferably carried out in apparatus of the type described in conjunction with FIG. 1 at a temperature between about 1200 and 1250° C. in an atmosphere of essentially nitrogen and including about 1 percent oxygen to form p-conductivity type regions 75. In an exemplary embodiment of this invention utilizing a wafer of about 8 mils thickness where a subsequent boron diffusion is expected to be performed for forming further regions of the device, the actual aluminum diffusion may be performed for as few as about 10 hours; it being understood that further aluminum diffusion will take place during the boron diffusion which conventionally may be performed for about 30 hours insofar as only a relatively shallow region is required to be formed. FIG. 5F illustrates a cross section view of the device after diffusion. It is significant to note that all of the alloyed aluminum-silicon may not be completely depleted by the diffusion, thus leaving regions of relatively heavy aluminum concentration at the surfaces of the device.

Figure 6:
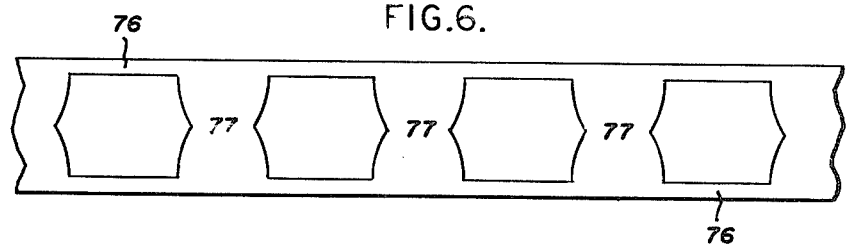
FIG. 6 is a section view of a wafer having a blanket diffusion and selective isolation diffusion performed simultaneously in accordance with this invention.

FIG. 6 illustrates a cross section view of the device in accordance with this invention wherein blanket diffusions 76 and isolation diffusions 77 are formed simultaneously. The preparation of the wafer to be diffused for forming simultaneous isolation and blanket diffusions is the same as has been hereinabove described in conjunction with FIGS. 3, 4, or 5. During the diffusion process, it is necessary to reduce the amount of oxygen in the otherwise inert gas stream to the extent that not all of the aluminum which is vaporized during diffusion is purged by the oxidation thereof by the oxygen in the gas stream and carried away. Accordingly, it is necessary to reduce the oxygen content of the gas stream below about one percent to near zero percent in order to perform blanket and isolation diffusions simultaneously. During the drive-in portion of the diffusion process, it may be desirable to begin the diffusion with no oxygen in the gas flow in order to allow the blanket portion of the diffusion to commence. The introduction of oxygen into the gas flow after the commencement of the blanket portion of the diffusion will not halt the diffusion of impurity atoms already in the wafer but will prevent additional impurity atoms from being supplied by the aluminum pattern on the wafer and will, therefore, effectively control the impurity concentration in the blanket diffused portion of the device.

FIG. 7 illustrates graphically the time advantage to be obtained through the use of the instant invention. It will be seen by reference to FIG. 7 that, for example, in a wafer having a thickness of between about 8 and 9 mils which requires diffusion from each surface of between about 4 and 4.5 mils, a diffusion which would take about 160 hours utilizing boron as a dopant can be accomplished in about 45 hours in accordance with the method of the instant invention. Similarly, a diffusion which will take about 230 hours utilizing boron can be accomplished in about 75 hours. A substantial time saving is apparent. The instant invention may be especially important where it is desired to provide isolation regions in high power devices of even greater thickness. It will be seen by reference to the graph that a wafer having a thickness of about 14 mils would require in excess of 400 hours to diffuse in accordance with prior art methods while the instant invention provides for diffusion in a time under that presently required to provide similar diffusions in wafers having thicknesses closer to 8 mils.

While the invention has been particularly shown and described with reference to several preferred embodiments thereof, it will be understood by those skilled in the art that various changes in form and detail may be made therein without departing from the true spirit and scope of the invention as defined by the appended claims.

What is claimed is:

1. A method for simultaneously forming a relatively shallow blanket diffusion and a relatively deeper selective isolation diffusion in a semiconductor comprising:
   providing a semiconductor wafer;
   selectively applying an aluminum pattern to a first surface of said wafer only to those areas under which said relatively deep isolation diffusion is desired;
   inserting said wafer into an open diffusion tube;
   introducing a flow of inert gas into a first end of said diffusion tube and exhausting said gas from a second end of said tube;
   heating said tube to a temperature sufficient to cause aluminum to diffuse from said pattern directly into the bulk of said wafer underlying said pattern to form said deep isolation diffusions, and further to vaporize said aluminum and to diffuse said aluminum into the surface of said wafer not covered by said pattern to form said blanket diffusion; and
   introducing a preselected percent of oxidizing gas into said gas after said blanket diffusion has been initiated to stop the further vaporization of said aluminum while said diffusion from said pattern continues whereby a deep selective isolation diffusion and a shallow blanket diffusion are simultaneously formed.

2. The method of claim 1 further comprising forming a second aluminum pattern on a second surface of said wafer, said second aluminum pattern being identical to said aluminum pattern and in registration therewith.

3. The method claim 1 wherein applying said aluminum pattern comprises depositing aluminum on essentially the entire surface of said wafer; and
   etching away all of said aluminum except those areas under which isolation diffusions are desired.

4. The method of claim 1 wherein introducing said flow of gas comprises introducing said flow of gas at a rate of between about one and about five liters per minute per 100 mm of inside tube diameter.

5. The method of claim 4 wherein said amount of oxygen is between about zero and about ten percent.

6. The method of claim 1 wherein said preselected percent of oxidizing gas comprises between about zero and about 1 percent of oxygen.

* * * * *